United States Patent
Mitsui

(10) Patent No.: US 8,041,105 B2
(45) Date of Patent: Oct. 18, 2011

(54) PATTERN EVALUATION METHOD, COMPUTER-READABLE MEDIUM, AND SEMICONDUCTOR DEVICE MANUFACTURING METHOD

(75) Inventor: Tadashi Mitsui, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1061 days.

(21) Appl. No.: 11/896,043

(22) Filed: Aug. 29, 2007

(65) Prior Publication Data

US 2008/0056558 A1  Mar. 6, 2008

(30) Foreign Application Priority Data

Aug. 30, 2006  (JP) .................................. 2006-234052

(51) Int. Cl.
*G06K 9/00* (2006.01)
*H03C 3/00* (2006.01)
*H03D 3/00* (2006.01)

(52) U.S. Cl. .......................... 382/145; 332/102; 329/305

(58) Field of Classification Search .................. 382/144, 382/145, 165, 170, 181, 199; 330/4.9, 250, 330/299; 332/102, 105, 110, 116, 130, 152; 329/301, 305, 314, 342, 362; 438/46, 63, 438/77, 967, 968

See application file for complete search history.

(56) References Cited

U.S. PATENT DOCUMENTS 5,613,013 A * 3/1997 Schuette ........................ 382/124
7,588,868 B2 * 9/2009 Zach et al. ....................... 430/22

FOREIGN PATENT DOCUMENTS

| JP | 2-189691 | 7/1990 |
|----|----------|--------|
| JP | 2000-163560 | 6/2000 |
| JP | 2001-320719 | 11/2001 |
| JP | 2002-15692 | 1/2002 |
| JP | 2003-178314 | 6/2003 |
| JP | 2004-294100 | 10/2004 |
| JP | 2005-69939 | 3/2005 |
| JP | 2006-275952 | 10/2006 |
| WO | WO 03/044821 | 5/2003 |

OTHER PUBLICATIONS

Notification of Reasons for Rejection issued by the Japanese Patent Office in Japanese Patent Application No. 2006-234052, mailed Jul. 21, 2009.
Notification of Reasons for Rejection issued by the Japanese Patent Office in Japanese Patent Application No. 2006-234052, mailed Jan. 30, 2009.
Decision of Final Rejection issued by the Japanese Patent Office on Oct. 27, 2009, for Japanese Patent Application No. 2006-234052, and English-language translation thereof.

* cited by examiner

*Primary Examiner* — Abolfazl Tabatabai
(74) *Attorney, Agent, or Firm* — Finnegan, Henderson, Farabow, Garrett & Dunner, L.L.P.

(57) ABSTRACT

A pattern evaluation method includes: acquiring a plurality of examination images obtained in regard to an evaluation target pattern, at least one of the plurality of examination images being different from the other examination images; detecting all edges of the evaluation target pattern in each of the examination images; executing alignment of the evaluation target pattern in the respective examination images with a sub-pixel accuracy based on the detected edges; superimposing the aligned pattern edges to generate a single combined edge; measuring the combined edge; and evaluating the evaluation target pattern based on a result of the measurement.

20 Claims, 4 Drawing Sheets

PATTERN EVALUATION METHOD, COMPUTER-READABLE MEDIUM, AND SEMICONDUCTOR DEVICE MANUFACTURING METHOD

CROSS REFERENCE TO RELATED APPLICATION

This application claims benefit of priority under 35 USC §119 to Japanese patent application No. 2006-234052, filed on Aug. 30, 2006, the contents of which are incorporated by reference herein.

BACKGROUND OF THE INVENTION

1. Field of the Invention

The present invention relates to a pattern evaluation method, a computer-readable medium, and a semiconductor device manufacturing method.

2. Related Background Art

A method of detecting an edge of an evaluation target pattern to evaluate a shape of the pattern has been extensively adopted in various industrial fields. For example, a method of using an SEM (Scanning Electron Microscope) image as a pattern examination image to evaluate a shape of a processed device pattern and thereby judge whether the pattern is good or bad is utilized in evaluation of a pattern of a semiconductor device. A procedure of measuring a CD (Critical Dimension) based on this method will be explained hereinafter as a conventional technology.

At first, an SEM image at a predetermined position on a wafer is acquired as an examination image by a CD SEM. This image includes a specific pattern as an evaluation target.

At second, one or more ROIs (Regions of Interest) are set so as to include a pattern of interest in the SEM image, edges of the patterns in the ROIs are detected based on, e.g., a threshold method, a dimension between the edges is calculated, and an obtained result is output as a CD value. The thus obtained one or more dimension values are collated with a separately determined standard to judge pass-fail of the evaluation target pattern.

According to the conventional technology, since an accuracy of a measurement value is dependent on a magnification of an image, there is a problem that a desired measurement accuracy cannot be obtained when the magnification must be reduced for various reasons. When intentionally reducing a magnification of an image in pattern measurement, the following cases can be quoted, for example.

1. When a shrinking effect should be reduced by suppressing electron beam irradiation damages given to a resist pattern as much as possible.
2. When an image having a higher image quality should be obtained by reducing charging.
3. When as many measurement points as possible should be put in one image in order to reduce the number of acquired images.
4. When patterns which are apart from each other and would protrude from an image acquiring region with a high magnification should be measured.
5. When a central part alone of an image excluding a peripheral region should be measured since the peripheral region of an image acquiring region has a large image distortion.

A size, i.e., a magnification of the image acquiring region can be determined in accordance with each of the purposes. On the other hand, measuring an image acquired with a high magnification is of course preferable in order to improve measurement accuracy. However, considering the fact that an electron beam diameter is approximately 3 nm, a higher magnification beyond this value is meaningless as an image resolution, and there is a problem that an influence of degradation in an image due to, e.g., charging of an electron beam is exercised.

SUMMARY OF THE INVENTION

According to a first aspect of the present invention, there is provided a pattern evaluation method comprising:

acquiring a plurality of examination images obtained in regard to an evaluation target pattern, at least one of the plurality of examination images being different from the other examination images;

detecting all edges of the evaluation target pattern in each of the examination images;

executing alignment between the evaluation target pattern of the examination images with a sub-pixel accuracy based on the detected edges;

superimposing the edges of the aligned pattern to generate a single combined edge;

measuring the combined edge; and evaluating the evaluation target pattern based on a result of the measurement.

According to a second aspect of the present invention, there is provided a pattern evaluation method comprising:

acquiring a plurality of examination images obtained in regard to an evaluation target pattern, at least one of the plurality of examination images being different from the other examination images;

executing alignment between the examination images with a sub-pixel accuracy;

superimposing the aligned images to generate a single combined image;

detecting all edges of the superimposed evaluation target pattern in the combined image;

measuring the detected edges; and evaluating the evaluation target pattern based on a result of the measurement.

According to a third aspect of the present invention, there is provided a computer-readable medium to allow a computer to execute a pattern evaluation method, the pattern evaluation method comprising:

acquiring a plurality of examination images obtained in regard to the same evaluation target pattern, at least one of the plurality of examination images being different from the other examination images;

detecting all edges of the evaluation target pattern in each of the examination images;

executing alignment between the evaluation target pattern of the examination images with a sub-pixel accuracy based on the detected edges;

superimposing the edges of the aligned pattern to generate a single combined edge;

measuring the combined edge; and evaluating the evaluation target pattern based on a result of the measurement.

According to a fourth aspect of the present invention, there is provided a computer-readable medium to allow a computer to execute a pattern evaluation method, the pattern evaluation method comprising:

executing alignment between the examination images with a sub-pixel accuracy;

superimposing the aligned images to generate a single combined image;

detecting all edges of the superimposed evaluation target pattern in the combined image;

measuring the detected edges; and evaluating the evaluation target pattern based on a result of the measurement.

According to a fifth aspect of the present invention, there is provided a semiconductor device manufacturing method comprising executing a semiconductor device manufacturing process onto a substrate when it is determined that examination target pattern formed on the substrate for a semiconductor device satisfies a required specification of the semiconductor device as a result of evaluation based on a pattern evaluation method, the pattern evaluation method includes:

acquiring a plurality of examination images obtained in regard to an evaluation target pattern, at least one of the plurality of examination images being different from the other examination images;

detecting all edges of the evaluation target pattern in each of the examination images;

executing alignment between the evaluation target pattern of the examination images with a sub-pixel accuracy based on the detected edges;

superimposing the edges of the aligned pattern to generate a single combined edge;

measuring the combined edge; and evaluating the evaluation target pattern based on a result of the measurement.

According to a sixth aspect of the present invention, there is provided a semiconductor device manufacturing method comprising executing a semiconductor device manufacturing process onto a substrate when it is determined that examination target pattern formed on the substrate for a semiconductor device satisfies a required specification of the semiconductor device as a result of evaluation based on a pattern evaluation method, the pattern evaluation method includes:

acquiring a plurality of examination images obtained in regard to an evaluation target pattern, at least one of the plurality of examination images being different from the other examination images;

executing alignment between the examination images with a sub-pixel accuracy;

superimposing the aligned images to generate a single combined image;

detecting all edges of the superimposed evaluation target pattern in the combined image;

measuring the detected edges; and evaluating the evaluation target pattern based on a result of the measurement.

DETAILED DESCRIPTION OF THE INVENTION

An embodiment according to the present invention will now be explained hereinafter. In the following embodiment, examination of a shape of a fine pattern formed at semiconductor manufacturing processes, e.g., a lithography process or an etching process will be taken as an example and explained, but the present invention is not restricted to this example, and it is to be noted that the present invention can be carried out in general as a pattern evaluation method concerning pattern examination processes in other various industrial fields.

(1) Pattern Evaluation Method

Figure 1:
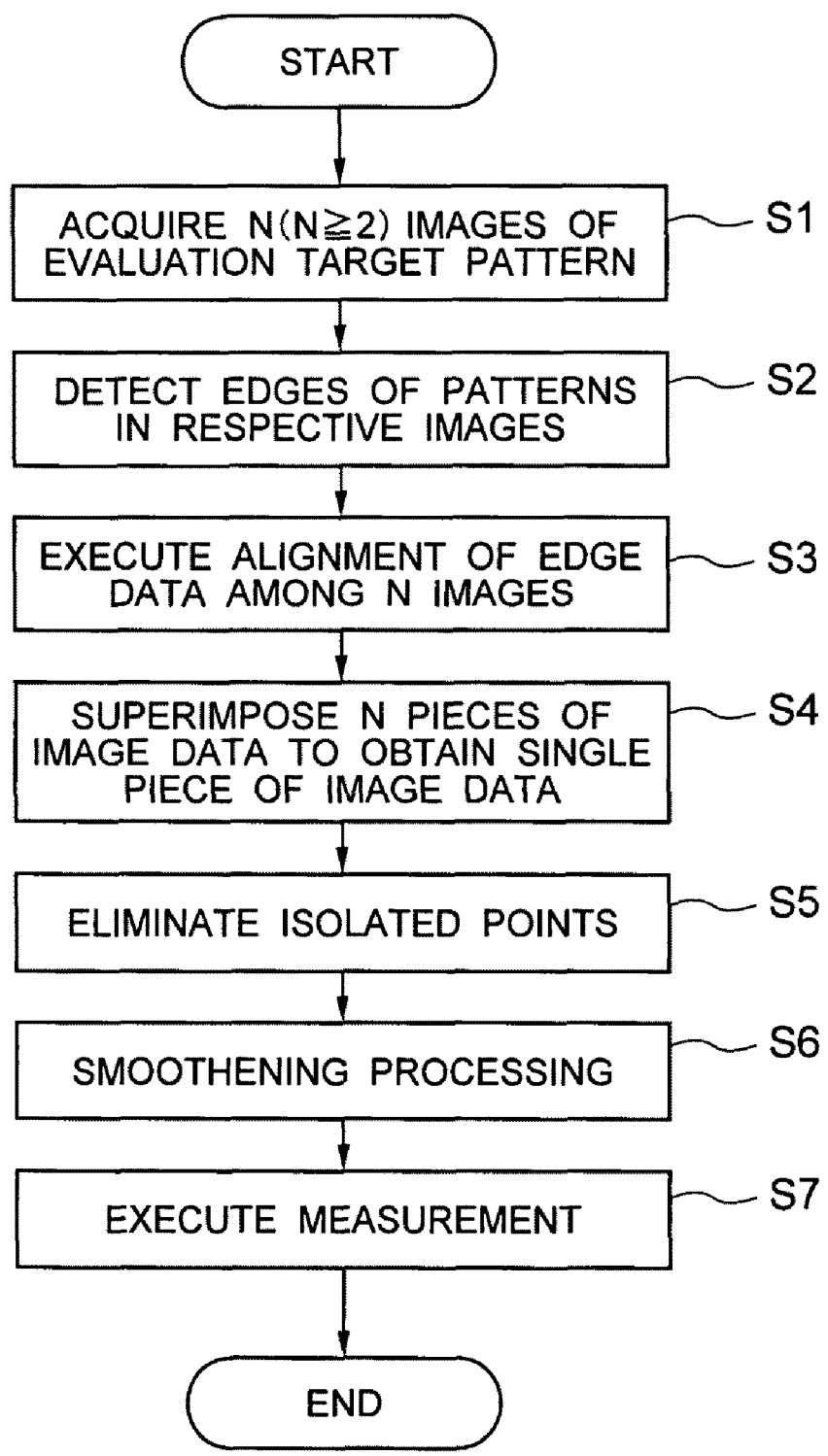
FIG. 1 is a flowchart showing an outline procedure of an embodiment of a pattern evaluation method according to the present invention.
Figure 2:
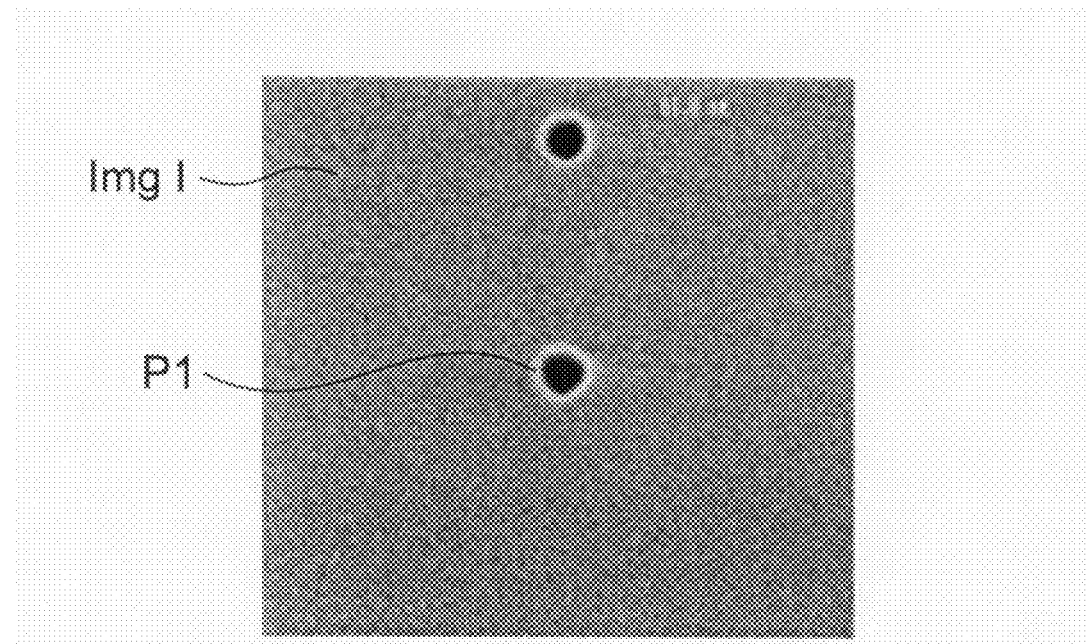
FIG. 2 is a view showing an example of an examination image.

FIG. 1 is a flowchart showing an outline procedure of a pattern evaluation method according to this embodiment, and FIG. 2 is a view showing an example of an examination image. In this embodiment, an example of measuring a pattern P1 placed at the center of an examination image depicted in FIG. 2 will be explained.

At first, N (N≧2) images of an evaluation target pattern P1 are acquired (FIG. 1, a step S1). At least one of the images is different from the other images. Although 10 (N=10) CDSEM images are used in this embodiment, the number of images may be larger or smaller than this value. Further, an optical microscopic image may be used in accordance with a required specification of a product or a resolution of an imaging unit. FIG. 2 shows an example of a CDSEM image Img 1 which has a size of 512×512 pixels and is obtained with a magnification of 150 k. In this case, since an image of a pattern in a 0.9 micron square region is obtained, a calibration value becomes approximately 1.75777 [nm/pixel].

Although the same image acquiring conditions are used in this embodiment, some images may be acquired under different conditions, or respective acquiring conditions may be different from each other. If all images are not completely equal to each other, pattern positions in the images are slightly different from each other because of several factors. However, any means, e.g., moving a stage of the CDSEM or shifting an electron beam may be used to intentionally change a pattern position or change a scan direction.

Then, an edge of the pattern P1 is detected with respect to each image (FIG. 1, a step S2). Although many techniques of detecting an edge have been devised, using a technique satisfying the following requirements like a technique disclosed in Japanese Patent Application Laid-open No. 2003-178314 is desirable. Disclosures of Japanese Patent Application Laid-open No. 2003-178314 are herein incorporated by reference. Of course, other edge detection techniques may be used.

1. Since an accuracy of a detected edge affects a final evaluation result, an edge with a sub-pixel accuracy can be detected.
2. Since edges of all patterns must be detected, ROI does not have to be set.

Figure 3:
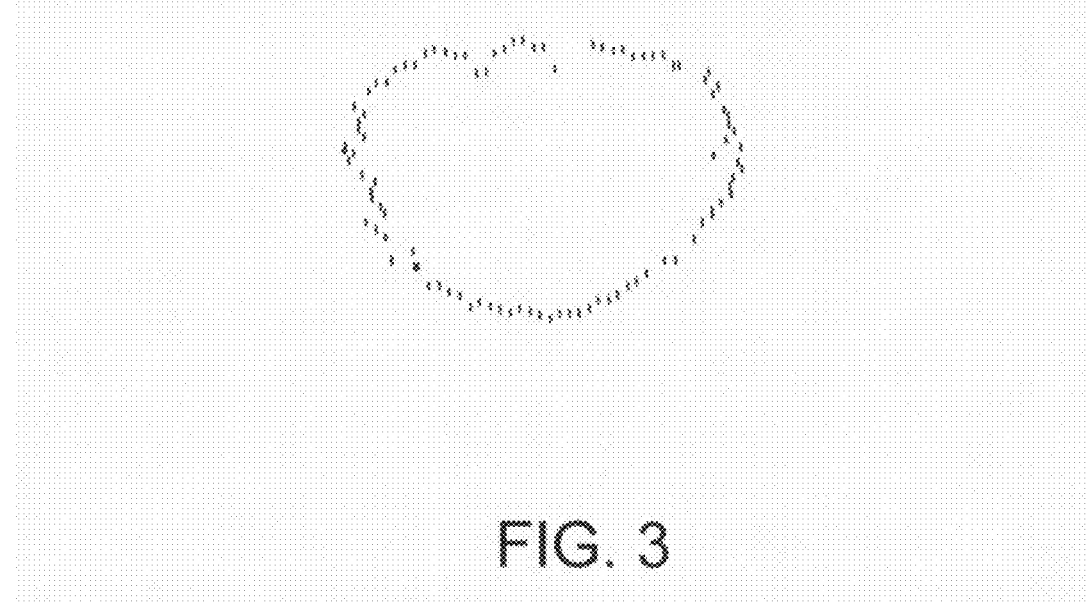
FIG. 3 is a view showing an example of edge points detected from one examination image.

FIG. 3 shows an example of edge data detected based on the above-explained procedure.

Then, the respective pieces of edge data of the N examination images obtained based on the above-explained procedure are aligned with specific data, e.g., edge data of the first image being used as a reference (FIG. 1, a step S3). Using pattern matching for alignment is desirable. Although many pattern matching techniques have been devised, a technique proposed in Japanese Patent Laid Open (kokai) 2006-275952 is used in this embodiment. According to this matching, the respective pieces of edge data of the 10 examination images can be aligned at a high speed with a sub-pixel accuracy. Furthermore, a pattern edge which is equal to or below a set matching score may be excluded from an alignment target. In this case, this pattern edge is also excluded from a later-explained edge data superimposition target. Disclosures of Japanese Patent Laid Open (kokai) 2006-275952 are herein incorporated in the present application by reference. It is to be noted that pattern matching is not restricted to the above-explained technique, and any technique may be used.

Figure 4:
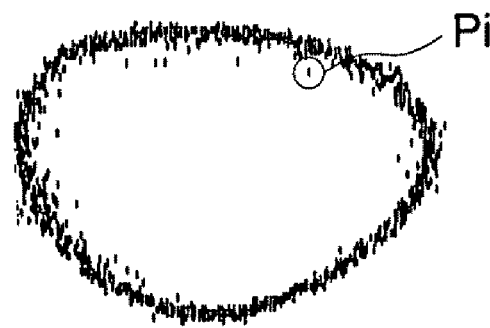
FIG. 4 is a view showing an example where edge points detected from 10 examination images are superimposed.

Then, an alignment result obtained based on the above-explained procedure is used to superimpose the respective pieces of edge data of the N examination images as one piece of edge data. FIG. 4 shows an example where edge points detected from the 10 examination images are superimposed. It is to be noted that a resolution of the edge data obtained here is not a resolution of the edge data before superimposition but it is determined based on a resolution of matching. Since the resolution for edge acquisition is usually dependent on a resolution of an image, a desired resolution cannot be obtained from an image with a low magnification. However, according to the pattern evaluation method according to this embodiment, since the resolution for matching can be determined irrespective of an image magnification, edge data with a desired resolution can be obtained from an image with a low magnification.

Figure 5:
FIG. 5 is a view showing an example where isolated points are eliminated from edge data depicted in FIG. 4.

Isolated points due to, e.g., noise are scattered in the edge data superimposed based on the above-explained procedure as denoted by, e.g., reference character Pi in FIG. 4. Processing of eliminating the isolated points Pi from the superimposed edge data is then carried out (FIG. 1, a step S5). FIG. 5 shows an example where the isolated points are eliminated from the edge data depicted in FIG. 4. More specifically explaining the isolated point eliminating processing, points apart from peripheral edge points by a predetermined distance or more are regarded as the isolated points, and these points are eliminated.

Figure 6:
FIG. 6 is a view showing an example where edge data depicted in FIG. 5 is subjected to smoothing processing.

Although the edge data is obtained by superimposing the plurality of pieces of edge data generated from the plurality of images of the same pattern P1, the edge data has not only the isolated points caused due to, e.g., noise but also extensity to some extent because of an image fluctuation caused by e.g. apparatus stability of the CDSEM, charging of a specimen or a rounding error in digitizing the images. Thus, an average position of all edge points which are present in, e.g., three pixels near the reference edge data, e.g., the edge data of the first examination image is calculated, and smoothing processing of determining this position as a new edge point is carried out (FIG. 1, a step S6). FIG. 6 shows an example where the edge data depicted in FIG. 5 is subjected to smoothing processing.

At last, the smoothed edge data is measured to obtain a desired measurement value (FIG. 1, a step S7). For example, a maximum diameter of the pattern is measured in this embodiment. Of course, the present invention is not restricted to the maximum diameter of the pattern, and any technique can be used to measure any target, e.g., a diameter of the pattern in an X axis direction or an area of the pattern.

According to this embodiment, even if an image has a low magnification, a measurement result comparable to that obtained by measuring an image with a high magnification can be acquired.

(2) Program

The series of procedures in the pattern evaluation method can be incorporated in a program executed by a computer, and the program can be stored in a recording medium, e.g., a flexible disk or a CD-ROM so that it can be read and executed by the computer. As a result, the pattern evaluation method according to the present invention can be realized by a general-purpose computer which can perform image processing. The recording medium is not restricted to a portable type, e.g., a magnetic disk or an optical disk, and a stationary recording medium, e.g., a hard disk or a memory can be used. Moreover, the program having the series of procedures of the pattern evaluation method incorporated therein may be distributed through a communication line (including wireless communication), e.g., the Internet. Additionally, the program having the series of procedures of the pattern evaluation method incorporated therein may be distributed via a cable line or a wireless line, e.g., the Internet in an encrypted, modulated, or compressed stated, or may be stored in a recording medium to be distributed.

(3) Semiconductor Device Manufacturing Method

Since using the above-explained pattern evaluation method in a process of manufacture of a semiconductor device enables evaluating a pattern with a high accuracy, the semiconductor device can be manufactured with a higher throughput or yield ratio.

More specifically, a semiconductor substrate is sampled in units of production lot, and a pattern formed on the sampled semiconductor substrate is evaluated based on the above-explained pattern evaluation method. When the semiconductor substrate is determined as a good product as a result of examination, the remaining manufacturing processes are executed with respect to the entire production lot to which the examined semiconductor substrate belongs. On the other hand, in a case where the sampled semiconductor substrate is determined as a poor product as a result of examination and reworking processing is possible, the reworking processing is executed with respect to the production lot to which the semiconductor substrate determined as a poor product belongs. Upon completion of the reworking processing, a semiconductor substrate is again sampled from this production lot to be examined. When the sampled semiconductor substrate is determined as a good product as a result of reexamination, the remaining manufacturing processes are executed with respect to the reworked production lot. Further, when the reworking processing is impossible, the production lot to which the semiconductor substrate determined as a poor product belongs is discarded, a factor of occurrence of a defect is analyzed, and an analysis result is fed back to, e.g., a person who is in charge of design or a person who is in charge of subsequent processes.

Although the embodiment according to the present invention has been explained above, the present invention is not restricted to the foregoing embodiment, and it can be modified and carried out in many ways within the scope of the present invention. For example, although edges of all examination images are detected and then aligned in the foregoing embodiment, the edges may be detected and then immediately aligned. Furthermore, in place of detecting edges and then carrying out alignment, alignment may be performed with respect to all examination images, then a result of alignment may be utilized to superimpose all the images, and an edge may be detected with respect to the obtained combined image.

What is claimed is:

1. A pattern evaluation method causing a computer to perform operations of:

acquiring a plurality of examination images obtained in regard to an evaluation target pattern, at least one of the plurality of examination images being different from the other examination images;

detecting, by the computer, all edges of the evaluation target pattern in each of the examination images;

executing, by the computer, alignment between the evaluation target pattern of the examination images with a sub-pixel accuracy based on the detected edges;

superimposing the edges of the aligned pattern to generate a single combined edge;

measuring the combined edge; and evaluating the evaluation target pattern based on a result of the measurement.

2. The pattern evaluation method according to claim 1, wherein the alignment is executed using pattern matching, and
a pattern edge which is equal to or below a set matching score is excluded from a superimposition target in generating the combined edge.

3. The pattern evaluation method according to claim 1, wherein at least one of the examination images is obtained under image acquiring conditions different from those of the other examination images.

4. The pattern evaluation method according to claim 3, wherein the examination images are SEM images, and the different image acquiring conditions mean a difference in electron beam scan direction.

5. The pattern evaluation method according to claim 1, further comprising eliminating isolated points from the combined edge.

6. The pattern evaluation method according to claim 1, further comprising performing smoothing processing with respect to the combined edge.

7. A pattern evaluation method causing a computer to perform operations of:
acquiring a plurality of examination images obtained in regard to an evaluation target pattern, at least one of the plurality of examination images being different from the other examination images;
executing, by the computer, alignment between the examination images with a sub-pixel accuracy;
superimposing the aligned images to generate a single combined image;
detecting, by the computer, all edges of the superimposed evaluation target pattern in the combined image;
measuring the detected edges; and
evaluating the evaluation target pattern based on a result of the measurement.

8. The pattern evaluation method according to claim 7, wherein the alignment is executed using pattern matching, and
an examination image which is equal to or below a set matching score is excluded from a superimposition target in generating the combined image.

9. The pattern evaluation method according to claim 7, wherein at least one of the examination images is obtained under image acquiring conditions different from those of the other examination images.

10. The pattern evaluation method according to claim 9, wherein the examination images are SEM images, and the different image acquiring conditions mean a difference in electron beam scan direction.

11. The pattern evaluation method according to claim 7, further comprising eliminating isolated points from the combined edge.

12. The pattern evaluation method according to claim 7, further comprising performing smoothing processing with respect to the combined edge.

13. A computer-readable medium to allow a computer to execute a pattern evaluation method, the pattern evaluation method comprising:
acquiring a plurality of examination images obtained in regard to the same evaluation target pattern, at least one of the plurality of examination images being different from the other examination images;
detecting all edges of the evaluation target pattern in each of the examination images;
executing alignment between the evaluation target pattern of the examination images with a sub-pixel accuracy based on the detected edges;
superimposing the edges of the aligned pattern to generate a single combined edge;
measuring the combined edge; and
evaluating the evaluation target pattern based on a result of the measurement.

14. A computer-readable medium to allow a computer to execute a pattern evaluation method, the pattern evaluation method comprising:
acquiring a plurality of examination images obtained in regard to an evaluation target pattern, at least one of the plurality of examination images being different from the other examination images;
executing alignment between the examination images with a sub-pixel accuracy;
superimposing the aligned images to generate a single combined image;
detecting all edges of the superimposed evaluation target pattern in the combined image;
measuring the detected edges; and
evaluating the evaluation target pattern based on a result of the measurement.

15. A semiconductor device manufacturing method comprising executing a semiconductor device manufacturing process onto a substrate when it is determined that examination target pattern formed on the substrate for a semiconductor device satisfies a required specification of the semiconductor device as a result of evaluation based on a pattern evaluation method, the pattern evaluation method includes:
acquiring a plurality of examination images obtained in regard to an evaluation target pattern, at least one of the plurality of examination images being different from the other examination images;
detecting all edges of the evaluation target pattern in each of the examination images;
executing alignment between the evaluation target pattern of the examination images with a sub-pixel accuracy based on the detected edges;
superimposing the edges of the aligned pattern to generate a single combined edge;
measuring the combined edge; and
evaluating the evaluation target pattern based on a result of the measurement.

16. The semiconductor device manufacturing method according to claim 15,
wherein the alignment is executed using pattern matching, and
a pattern edge which is equal to or below a set matching score is excluded from a superimposition target in generating the combined edge.

17. The semiconductor device manufacturing method according to claim 15,
wherein at least one of the examination images is obtained under image acquiring conditions different from those of the other examination images.

18. A semiconductor device manufacturing method comprising executing a semiconductor device manufacturing process onto a substrate when it is determined that examination target pattern formed on the substrate for a semiconductor device satisfies a required specification of the semiconductor device as a result of evaluation based on a pattern evaluation method, the pattern evaluation method includes:

acquiring a plurality of examination images obtained in regard to an evaluation target pattern, at least one of the plurality of examination images being different from the other examination images;

executing alignment between the examination images with a sub-pixel accuracy;

superimposing the aligned images to generate a single combined image;

detecting all edges of the superimposed evaluation target pattern in the combined image;

measuring the detected edges; and evaluating the evaluation target pattern based on a result of the measurement.

19. The semiconductor device manufacturing method according to claim 18, wherein the alignment is executed using pattern matching, and a pattern edge which is equal to or below a set matching score is excluded from a superimposition target in generating the combined edge.

20. The semiconductor device manufacturing method according to claim 18, wherein at least one of the examination images is obtained under image acquiring conditions different from those of the other examination images.

* * * * *